(12) United States Patent
Ding et al.

(10) Patent No.: US 8,932,929 B2
(45) Date of Patent: Jan. 13, 2015

(54) THIN FILM TRANSISTOR MEMORY AND ITS FABRICATING METHOD

(75) Inventors: Shijin Ding, Shanghai (CN); Sun Chen, Shanghai (CN); Xingmei Cui, Shanghai (CN); Pengfei Wang, Shanghai (CN); Wei Zhang, Shanghai (CN)

(73) Assignee: Fudan University, Shanghai (CN)

( * ) Notice: Subject to any disclaimer, the term of this patent is extended or adjusted under 35 U.S.C. 154(b) by 43 days.

(21) Appl. No.: 13/812,070

(22) PCT Filed: Apr. 24, 2012

(86) PCT No.: PCT/CN2012/000549
§ 371 (c)(1),
(2), (4) Date: Jan. 24, 2013

(87) PCT Pub. No.: WO2013/152458
PCT Pub. Date: Oct. 17, 2013

(65) Prior Publication Data
US 2013/0264632 A1 Oct. 10, 2013

(30) Foreign Application Priority Data
Apr. 10, 2012 (CN) .......................... 2012 1 012964

(51) Int. Cl.
*H01L 29/792* (2006.01)
*H01L 29/66* (2006.01)
*H01L 29/788* (2006.01)

(52) U.S. Cl.
CPC ........ *H01L 29/792* (2013.01); *H01L 29/66742* (2013.01); *H01L 29/66833* (2013.01); *H01L 29/66825* (2013.01); *H01L 29/7881* (2013.01)
USPC .............. 438/287; 257/325; 257/43; 438/151

(58) Field of Classification Search
CPC ............ H01L 29/792; H01L 29/66742; H01L 29/66833; H01L 29/42332; B82Y 10/00
USPC ............................................................ 257/43
See application file for complete search history.

(56) References Cited

U.S. PATENT DOCUMENTS

| 7,276,760 B2 * | 10/2007 | Bhattacharyya ............... 257/321 |
| 7,745,874 B2 * | 6/2010 | Lee et al. ........................ 257/325 |
| 8,643,386 B2 * | 2/2014 | Imai ............................... 324/629 |
| 2012/0056175 A1 * | 3/2012 | Takemura ........................ 257/43 |

* cited by examiner

*Primary Examiner* — Matthew W Such
*Assistant Examiner* — David Spalla
(74) *Attorney, Agent, or Firm* — Banner & Witcoff, Ltd.

(57) ABSTRACT

The invention relates to a thin film transistor memory and its fabricating method. This memory using the substrate as the gate electrode from bottom to up includes a charge blocking layer, a charge storage layer, a charge tunneling layer, an active region of the device and source/drain electrodes. The charge blocking layer is the ALD grown $Al_2O_3$ film. The charge storage layer is the two layer metal nanocrystals which include the first layer metal nanocrystals, the insulating layer and the second layer metal nanocrystals grown by ALD method in sequence from bottom to up. The charge tunneling layer is the symmetrical stack layer which includes the $SiO_2/HfO_2/SiO_2$ or $Al_2O_3/HfO_2/Al_2O_3$ film grown by ALD method in sequence from bottom to up. The active region of the device is the IGZO film grown by the RF sputtering method, and it is formed by the standard lithography and wet etch method. The TFT memory in this invention has the advantage with large P/E window, good data retention, high P/E speed, stable threshold voltage and simple fabricating process.

8 Claims, 4 Drawing Sheets

THIN FILM TRANSISTOR MEMORY AND ITS FABRICATING METHOD

FIELD OF INVENTION

The invention relates to a semiconductor integrated circuits manufacturing technology, and, particularly to a thin film transistor memory and its fabricating method.

BACKGROUND OF INVENTION

Nonvolatile memory is one of the indispensable elements in modern electronic devices, but most of the nonvolatile memories in the market are still the one based on silicon substrate. However, the traditional nonvolatile floating gate memories fabricated on monocrystalline silicon substrate are difficult to fabricate on the glass substrate due to the complicated fabricating method and high process temperature, and that will lead them subject to many restrictions when they are applied on the display panel.

Recently, a new nonvolatile memory based on thin film transistor (TFT) structure has aroused great attention. This type of nonvolatile memory not only can be fabricated on glass or flexible substrate but also has a good compatible with traditional TFT manufacturing process, thus the nonvolatile memory has a good prospects in the future advanced system panel or system package technology. Most of the present researches about the TFT memory still use the polycrystalline silicon as the channel material. However, it was reported that the TFT memories based on polycrystalline silicon do not have a good program/erase efficiency and data retention. Furthermore, when a bias stress is applied on source or drain electrode, there appears a large variation on threshold voltage.

Thus a new type of TFT memory with good program/erase efficiency, long data retention and stable threshold voltage is necessary.

SUMMARY OF THE INVENTION

The present invention is to provide a thin film transistor memory with large program/erase window, good data retention, high program/erase speed and stable threshold voltage. The other purpose of the present invention is to offer a fabricating method for the above mentioned memory.

To achieve the above mentioned purposes, the present invention provides a type of thin film transistor memory, which uses the gate electrode as substrate, and contains a charge blocking layer, a charge storage layer with two layer metal nanocrystals, a charge tunneling layer with symmetrical stack structure, an active region of the memory and source/drain electrodes from bottom to up.

Wherein, the said substrate is a heavily doped P type monocrystalline silicon wafer, heavily doped N type monocrystalline silicon wafer, ITO film, metal suicide film or the other materials with low resistivity and high conductivity.

The said charge blocking layer is the ALD (atomic layer deposition) growth $AlO_3$ film with a thickness of 15-200 nm.

The said charge storage layer has a two layer metal nanocrystals structure, which includes the following components grown by ALD method in sequence from bottom to up; the first layer metal nanocrystals, the insulating layer and the second layer metal nanocrystals. The material of the first and second layer metal nanocrystals is one of $RuO_x$ and Pt, that means the two layer nanocrystals can be grown by the same material (such as $RuO_x$ nanocrystals) or the different materials (such as Pt nanocrystals and $RuO_x$ nanocrystals). The insulting layer between the two layer metal nanocrystals is the $Al_2O_3$ or $SiO_2$ film with a thickness of 5-50 nm. Wherein, the mentioned $RuO_x$ nanocrystals are a kind of composite, which consists of metal Ru and Ru oxide, $1 > x > 0$.

The said charge tunneling layer has a symmetrical stack structure, which includes the first single layer, the second single layer and the third single layer grown by ALD method in sequence from bottom to up. Wherein, the second single layer is the $HfO_2$ film, the first and third single layer are used the same materials, $Al_2O_3$ or $SiO_2$.

The material of the said active region is an IGZO film grown by RE sputtering method with a thickness of 10-120 nm, and the standard lithography and wet etch process are used to form the active region.

Furthermore, the said gate electrode substrate is the heavily doped P type monocrystalline silicon wafer.

The above mentioned thin film transistor memory. Wherein, the areal density of the said first layer metal nanocrystals as well as the said second layer metal nanocrystals is $5\times10^{11} \sim 5\times10^{12} cm^2$ to increase the storage density, extend the program/erase window and improve the data retention. If the areal density of the nanocrystals is too low, it will go against the charge storage. If the areal density of the nanocrystals is too high, the adjacent nanocrystals will be too close, and this may lead the storage charges lose and go against the data retention.

The above mentioned thin film transistor memory, wherein, in the said charge tunneling layer, the thickness of each single layer is 1-10 nm, and the first and third layer have the same thickness.

In the above mentioned thin film transistor memory, wherein, the thickness of the said IGZO film is 10-120 nm.

The above mentioned thin film transistor memory, wherein, the said source/drain electrodes are the Al or Ag electrodes formed by the lift-off method with a thickness of 50-250 nm.

The TFT memory has a vast prospect in the future advanced system panel and system package technology, this invention adopts the two layer metal nanocrystals and symmetrical stack layer as the charge storage layer and tunneling layer, respectively, which can extend the program/erase window, improve the program/erase speed, and enhance the data retention and endurance.

This invention still provides the fabricating method of the above mentioned thin film transistor memory, which includes:

Step 1, using the standard RCA (Radio Corporation of America) method to clean the substrate, the said substrate is the heavily doped P type monocrystalline silicon wafer, heavily doped N type monocrystalline silicon wafer, ITO film, metal silicide film or the other materials with low resistivity and high conductivity. Preferentially, the heavily doped P type silicon wafer with a resistivity of 0.008-0.100 Ω·cm is used, and then clean it with the standard RCA method. Finally, the native oxide is removed by using hydrofluoric acid (HF).

Step 2, an $Al_2O_3$ film with a thickness of 15-200 nm is grown on the substrate by ALD method, the deposited temperature is kept at a range of 100~300° C., and the reactive precursors are trimethylaluminium (TMA) and water vapor.

Step 3, in sequence from bottom to up, the first layer metal nanocrystals, the insulting insulating layer and the second metal nanocrystals are grown on the charge blocking layer by ALD method, respectively.

Step 4, in sequence from bottom to up, the first single layer, the second single layer and the third single layer are grown on the second layer metal nanocrystals by ALD method to form the symmetrical stack layer as the charge tunneling layer, for example $SiO_2/HfO_2/SiO_2$ or $Al_2O_3/HfO_2/Al_2O_3$ film. Wherein, the reactive precursors for the $SiO_2$ film are tris(dimethylamino)silane and oxygen, the reactive precursors for the $Al_2O_3$ film are trimethylaluminium (TMA) and water vapor, and the reactive precursors for the $HfO_2$ film are tetrakis(ethylmethylamino)-hafnium (TEMAH) and water vapor. The growth temperature for the all films are kept at a range of 100~300° C. The thickness of each single film is 1-10 nm. Further, the first and third layer has the same thickness.

Step 5, an IGZO film with a thickness of 10-120 nm is grown on the third single layer by RF sputtering method, the working pressure is 50-200 w, the ratio of $O_2$ and Ar is in a range of 1:14:100, the growth temperature is 20-100° C.

Step 6, the first photoresist is spin-coated on the IGZO film, and then using the standard lithography method to form the protective layer on active region. Then, the rest IGZO film without the protective layer covered on it is etched by using wet etch method, the etchant is hydrochloric acid, nitric acid, phosphoric acid or hydrofluoric acid with a concentration of 0.01%~2%, and the etch time is 10-600 s.

Step 7, the active region can be formed after removing the first photoresist.

Step 8, the second photoresist is spin-coated on the IGZO film and the third single layer, and then the source/drain (S/D) region can be defined on the photoresist by standard lithography method, Step 9, a metal film is deposited by e-beam evaporation to form the S/D electrodes, and its thickness is 50-250 nm.

Step 10, the source and drain electrode are formed after removing the second photoresist.

The above mentioned fabricating method for TFT memory, wherein, the fabricating method still includes.

Step 11, the final device is annealed in nitrogen at 250° C. for 0.5~1.5 hours to improve the performance and stability.

The above mentioned fabricating method for TFT memory, wherein, in the said step 3, the first and second layers of metal nanocrystals can choose not only the same material but also different materials. Concretely, it can be one of the $RuO_x$ nanocrystals or Pt nanocrystals. Wherein, the mentioned $RuO_x$ nanocrystals are a kind of composite, which consists of metal Ru and Ru oxide, 1>x>0. The reactive precursors for $RuO_x$ nanocrystals is Bis(cyclopentadienyl)ruthenium and oxygen. Wherein, the insulating layer is the $Al_2O_3$ or $SiO_2$ film, and its thickness is 5-50 nm. The reactive precursors for $Al_2O_3$ film is trimethylaluminium (TMA) and water vapor.

In the above mentioned fabricating method for TFT memory, wherein, the material of the said S/D electrodes is Al or Ag.

The advantages of this invention:

1) Using two-layer metal nanocrystals as the charge storage layer can increase the storage charge density, extend the program/erase window and improve the data retention.

2) Using the symmetrical stack layer as tunneling layer can improve the program/erase speed and decrease the working voltage without infecting the data retention.

3) Using the amorphous IGZO film can provide the uniform carriers mobility and stable electrical performance. In addition, this invention has a good. prospect in the transparent and flexible electrical devices due to the high transparency and low process temperature of IGZO film.

4) Using ALD method can grow the metal nanocrystals below 400° C., thus it decreases the thermal budget during the whole process. Further, the process has a good compatible with TFT manufacturing technology. In addition, not only the thickness of the film can be controlled accurately but also the high quality film can be obtained by ALD technology. Especially, it can perform the digital controlling capability when the stack layer is grown as tunneling layer by ALD method.

5) In this invention, the charge blocking layer, charge storage layer and charge tunneling layer are deposited by the same method (ALL) technology), thus most of the steps can be completed in the ALD chamber in turn, and this will reduce the risk of the air contamination when the sample is transferred between the different equipments.

DETAILED DESCRIPTION OF THE EMBODIMENTS

The following contents further illustrate the detailed implementation of present invention in combination with attached drawings and detailed description of the embodiments. In the FIG, enlarging or diminishing sizes of the different layers and the area is to explain the present invention conveniently, and the shown sizes neither represent the actual sizes, nor reflect proportional relation of sizes.

Figure 9:
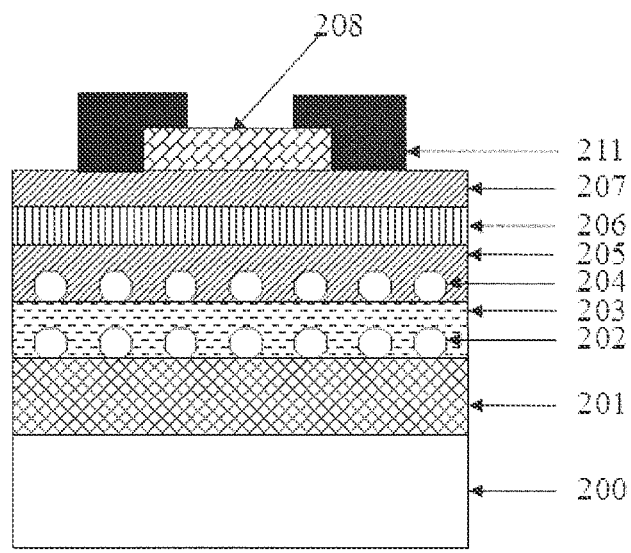
FIG. 9 is a cross-section view after the S/D electrodes are formed.

As shown in FIG. 9, it is the structure diagram of the TFT memory in this invention, the gate electrode 200 is used as the substrate, in sequence from bottom to up: charge blocking layer 201, charge storage layer which includes two-layer metal nanocrystals, charge tunneling layer with symmetrical stack structure, the active region of the device and source/drain electrodes.

The said gate electrode substrate 200 can be the heavily doped P type monocrystalline silicon wafer, heavily doped N type monocrystalline silicon wafer, ITO film, metal suicide film or the other materials with low resistivity and high conductivity.

The said charge blocking layer 201 is the ALD growth $Al_2O_3$ film with a thickness of 15-200 nm.

The said two-layer metal nanocrystals as the charge storage layer are grown by ALD technology, which includes the first layer metal nanocrystals 202, the insulating layer 203 and the second layer metal nanocrystals 204 in sequence from bottom to up. Wherein, the first and the second layer metal nanocrystals can be grown by either the same materials (such as using $RuO_x$ nanocrystals, wherein, 1>x>0) or the different materials (such as using Pt nanocrystals or $RuO_x$ nanocrystals, respectively). The areal density of each layer metal nanocrystals is $5\times10^{11}$~$5\times10^{12}$ cm$^{-2}$, The insulating layer between the two layer metal nanocrystals is the Al$_2$O$_3$ or SiO$_2$ film with a thickness of 5-50 nm. Wherein, the above mentioned RuO$_x$ nanocrystals are a kind of composite, which consists of metal Ru and Ru oxide.

The said charge tunneling layer is the Al$_2$O$_3$/HfO$_2$/Al$_2$O$_3$ or SiO$_2$/HfO$_2$/SiO$_2$ stack film grown by the ALD technology in sequence from bottom to up. In this stack layer, the thickness of each single layer is 1-10 nm, and the first and third layers have the same thickness.

The material for the said active region is an IGZO film grown by RF sputtering method with a thickness of 10-120 nm. The active region is formed by the standard lithography and wet etch technology.

The said S/D electrodes are the Al or Ag electrodes formed by the lift-off method, and its thickness is 50-250 nm.

The fabricating method of the above mentioned TFT memory includes the following step:

Step 1, using the standard RCA method to clean the heavily doped P type monocrystalline silicon wafer, and then the native oxide is removed by using HF, the resistivity of the said silicon wafer is 0.008-0.010 Ω·cm.

Figure 1:
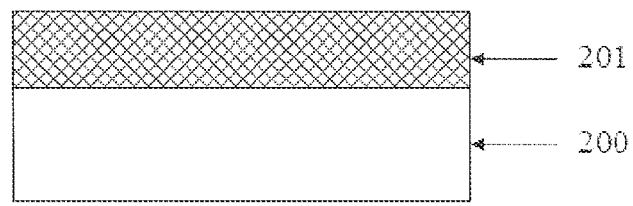
FIG. 1 is a schematic diagram which shows that an $Al_2O_3$ film is deposited on the heavily doped P type monocrystalline silicon substrate.

Step 2, a charge blocking layer 201 is deposited on the substrate 200 by ALD technology, shown as FIG. 1. Wherein, the substrate 200 is the clean heavily doped P type monocrystalline silicon wafer, the charge blocking layer 201 is an Al$_2$O$_3$ film. The deposited temperature is controlled in a range of 100~300° C., 200° C. is the best. The reactive precursors for Al$_2$O$_3$ film is trimethylaluminium (TMA) and water vapor. The thickness of the film is 15~200 nm, 70 nm is the best.

Figure 2:
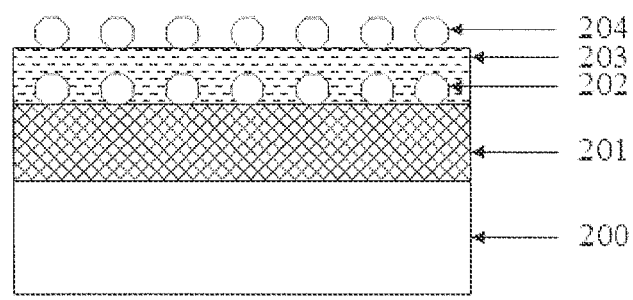
FIG. 2 is a schematic diagram which shows that the first layer metal nanocrystals, insulating layer and the second layer metal nanocrystals are deposited on the $Al_2O_3$ film in sequence from bottom to up.

Step 3, the first layer metal nanocrystals 202, the insulating layer 203 and the second layer metal nanocrystals 204 are grown in sequence from bottom to up on the charge blocking layer 201 by ALD technology to form the stack layer, shown as FIG. 2. Wherein, the first and second layer metal nanocrystals can be grown by either the same materials or the different materials. For example, the first layer metal nanocrystals 202 and the second layer metal nanocrystals 204 are both RuO$_x$ nanocrystals. The insulating layer 203 is an Al$_2$O$_3$ film. The reactive precursors for RuO$_x$ nanocrystals is Bis (cyclopentadienyl)ruthenium and oxygen. The areal density of the single layer of RuO$_x$ nanocrystals is $5\times10^{11}$ cm$^{-2}$. The reactive precursors for Al$_2$O$_3$ film is trimethylaluminium (TMA) and water vapor, its thickness is 5~50 nm, and 10 nm is the best.

Figure 3:
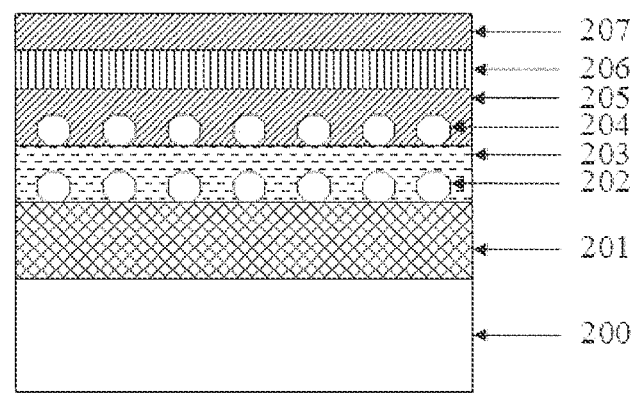
FIG. 3 is a schematic diagram which shows that the $SiO_2$, $HfO_2$, $SiO_2$ or $Al_2O_3$, $HfO_2$, $Al_2O_3$ stack layers are deposited on the second layer of metal nanocrystals in sequence from bottom to up.

Step 4, as shown in FIG. 3, the first single layer 205, the second single layer 206 and the third single layer 207 are grown on the second layer metal nanocrystals 204 in sequence from bottom to up by the ALD method to form the symmetrical stack layer, for example Al$_2$O$_3$/HfO$_2$/Al$_2$O$_3$ film. Wherein, the first single layer 205 and the third single layer 207 are the Al$_2$O$_3$ films, and the second single layer 206 is HfO$_2$ film. Wherein, the reactive precursors for the Al$_2$O$_3$ film are trimethylaluminium (TMA) and water vapor, and the reactive precursors for the HfO$_2$ film are tetrakis(ethylmethylamino)-hafnium (TEMAH) and water vapor. The growth temperature for the all films are kept at a range of 100~300° C., and 200° C. is the best. The thickness of the each single film is about 1-10 nm, and 6 nm is the best.

Figure 4:
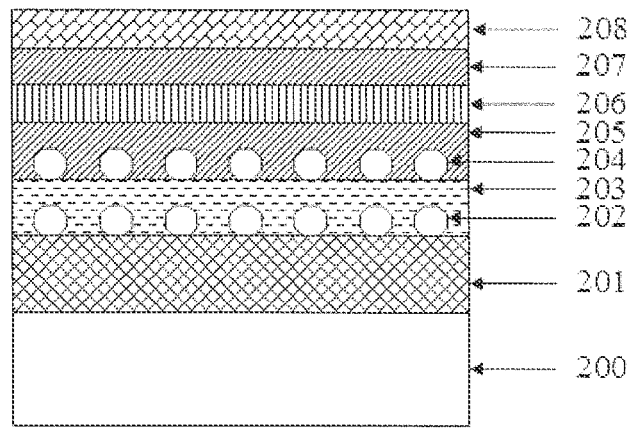
FIG. 4 is a schematic diagram which shows that the IGZO film is deposited on the stack layer.

Step 5, as shown in FIG. 4, an IGZO film 208 is grown on the third layer 207 by using RF sputtering method. The working pressure is 50-200 w, and the best choose is about 150 W. The ratio of O$_2$ and Ar is in a range of 1:1-1:100, 1:7 is the best. The growth temperature is kept at a range of 20-100° C., room temperature is the best. Finally, the thickness of the growth IGZO film is 10~120 nm, and the best choose is 60 nm.

Figure 5:
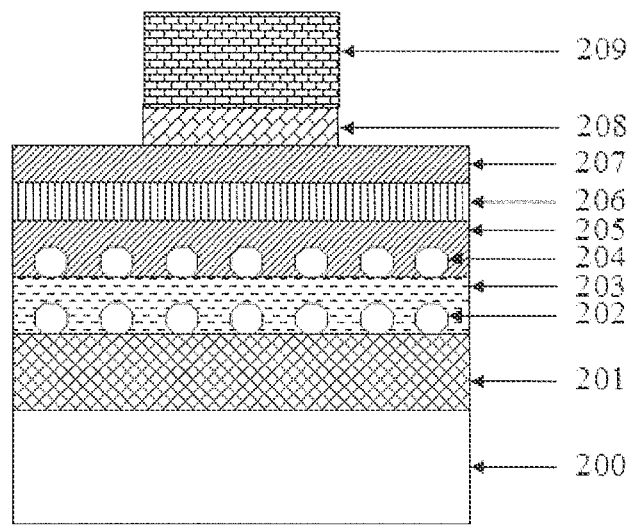
FIG. 5 is a cross-section view after the IGZO film is etched

Step 6, the first photoresist 209 is spin-coated on the IGZO film 208, and then using the standard lithography method to form the protective layer on the first photoresist 209 to protect active region. Then, the rest IGZO film without the protective layer on it is etched by using wet etch method, the etchant is hydrochloric acid, nitric acid, phosphoric acid or hydrofluoric acid with a concentration of 0.01%~2%, the etch time is 10-600 s, as shown in FIG. 5. The best etchant is diluted hydrochloric acid with a concentration of 1%.

Figure 6:
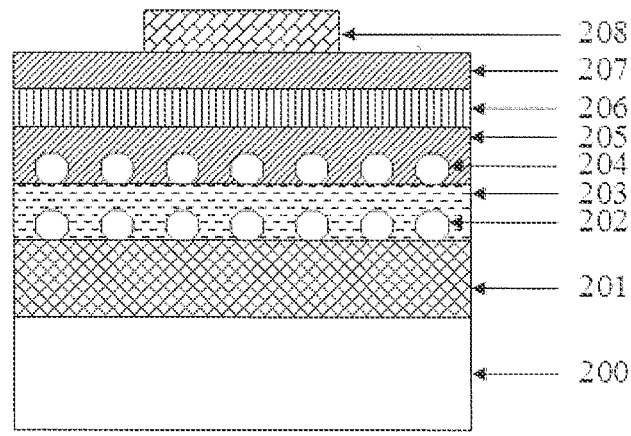
FIG. 6 is a cross-section view after the active region. of the device is formed.

Step 7, as shown in FIG. 6, the active region can be formed after removing the first photoresist 209.

Figure 7:
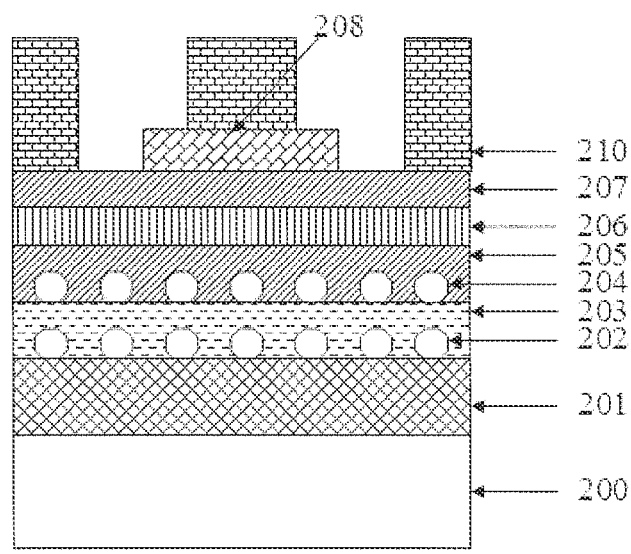
FIG. 7 is a cross-section view after the S/D region is defined on the photoresist.

Step 8, the second photoresist 210 is spin-coated on the IGZO film 208 and the third single layer 207 in the stack layer, and then the source/drain region can be defined on the second photoresist 210 by standard lithography method, as shown in FIG. 7.

Figure 8:
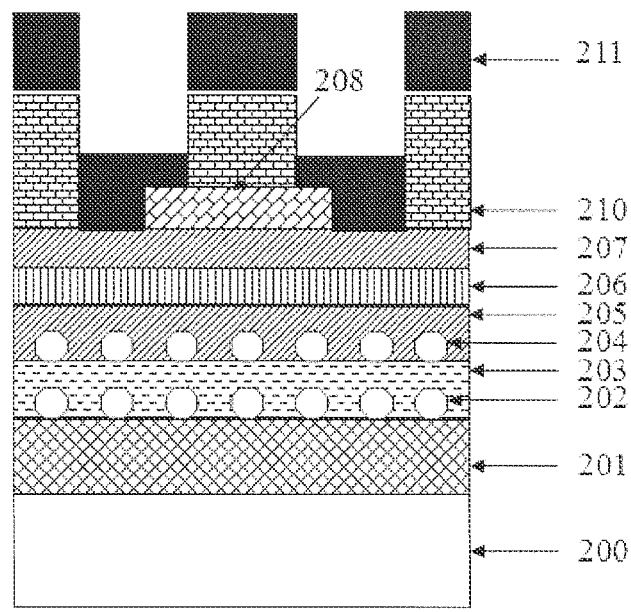
FIG. 8 is a cross-section view after the metal film (Ag or Al) is deposited.

Step 9, a metal film 211 is deposited by e-beam evaporation to form the S/D electrodes, as shown in FIG. 8. The material of the metal film is Al or Ag, and Al is the best. Its thickness is 50~250 nm, and 100 nm is the best.

Step 10, as shown in FIG. 9, the source and drain electrodes 211 are formed after removing the second photoresist.

Step 11, the final device is annealed in nitrogen at 250° C. for 0.5~1.5 hours, and 1 hour is the best.

Here, although the heavily doped P type monocrystalline silicon wafer is used as the substrate material, the substrate material should not be limited and it also can be the other materials, such as heavily doped N type silicon wafer, ITO film, metal suicide or materials with low resistivity and high conductivity. All modifications and alternative constructions that may occur to one skilled in the art that fairly fall within the basic teaching wherein set forth. Therefore, the protection scope of the present invention should be determined by the attached claims.

The TFT memory based on the IGZO film in this invention can extend the program/erase window, increase the P/E speed, improve the data retention and endurance performance by using two layer metal nanocrystals and symmetrical stack layer as charge trapping layer and tunneling layer, respectively.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching wherein set forth. Therefore, the protection scope of the present invention should be determined by the attached claims.

The invention claimed is:

1. A method of fabricating the thin film transistor memory, comprising the following steps,
   step 1, using the standard RCA method to clean a gate electrode substrate,
   step 2, growing a charge blocking layer film on the substrate by ALD method, the film is Al$_2$O$_3$, the deposited temperature is kept at a range of 100~300° C., and reactive precursors are trimethylaluminium (TMA) and water vapor,
   step 3, growing first layer metal nanocrystals, an insulating layer, and second layer metal nanocrystals on the charge blocking layer in sequence from bottom to top by ALD method, wherein the first layer metal nanocrystals and the second layer metal nanocrystals comprise either RuO$_x$ nanocrystals or Pt nanocrystals, wherein the nanocrystals, when comprising $RuO_x$, are a composite of metal Ru and Ru oxide, $1>x>0$, and the insulating layer comprises either $Al_2O_3$ or $SiO_2$ film, step 4, growing a first single layer, a second single layer and a third single layer on the second layer metal nanocrystals in sequence from bottom to up by ALD method to form a symmetrical stack layer, wherein the second single layer is a $HfO_2$ film, and the first single layer and third single layer contain the same materials and comprise $Al_2O_3$ or $SiO_2$, step 5, growing an IGZO film on the third single layer by using RF sputtering method, the working pressure is 50-200 w, the ratio of $O_2$ and Ar is in a range of 1:1-1:100, the growth temperature is 20-100° C., step 6, spin-coating a first photoresist on the IGZO film, and then using the standard lithography method, a protective layer is formed on the first photoresist to protect active region, then etching the rest IGZO film without the protective layer on it by using diluted hydrochloric acid, nitric acid, phosphoric acid or hydrofluoric acid with a concentration of 0.01%~2%, the etch time is 10-600 s, step 7, removing the first photoresist to form the active region, step 8, spin-coating a second photoresist on the IGZO film and the third single layer in the stack layer, and then defining the source/drain region on the second photoresist by standard lithography method, step 9, depositing a metal film by e-beam evaporation to form source and drain electrodes, step 10, removing the second photoresist.

2. The method of claim 1 further comprising step 11, annealing the final device in nitrogen at 250° C. for 0.5~1.5 hours.

3. The method of claim 1, wherein the reactive precursors for the $RuO_x$ nanocrystals are Bis(cyclopentadienyl)ruthenium and oxygen, and the reactive precursors for the $Al_2O_3$ film are trimethylaluminium (TMA) and water vapor.

4. The method of claim 3, wherein the material of the source/drain electrodes is Al or Ag.

5. The method of claim 1, wherein said gate electrode substrate is a heavily doped P type monocrystalline silicon wafer.

6. The method of claim 1, wherein the density of particles inside said first layer metal nanocrystals is $5 \times 10^{11} \sim 5 \times 10^{12}$ $cm^{-2}$, and the density of particles inside the second layer metal nanocrystals is $5 \times 10^{11} \sim 5 \times 10^{12}$ $cm^{-2}$.

7. The method of claim 1, wherein the thickness of each single layer in step 4 is 1-10 nm, and the first single layer and the third single layer have the same thickness.

8. The method of claim 1, wherein the thickness of said IGZO film is 10-120 nm.

* * * * *